(12) United States Patent
Lee et al.

(10) Patent No.: US 12,718,754 B2
(45) Date of Patent: Aug. 25, 2026

(54) DISPLAY DEVICE

(71) Applicant: LG Display Co., Ltd., Seoul (KR)

(72) Inventors: HoYoung Lee, Paju-si (KR); ChangHeon Kang, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 231 days.

(21) Appl. No.: 17/671,506

(22) Filed: Feb. 14, 2022

(65) Prior Publication Data

US 2022/0172678 A1 Jun. 2, 2022

Related U.S. Application Data

(63) Continuation of application No. 16/849,974, filed on Apr. 15, 2020, now Pat. No. 11,282,450, which is a (Continued)

(30) Foreign Application Priority Data

Dec. 31, 2013 (KR) ........................ 10-2013-0169271

(51) Int. Cl.
*G09G 3/3225* (2016.01)
*G09G 3/00* (2006.01)
(Continued)

(52) U.S. Cl.
CPC ......... *G09G 3/3225* (2013.01); *G09G 3/3266* (2013.01); *G09G 3/3275* (2013.01);
(Continued)

(58) Field of Classification Search
CPC ......... G09G 3/3225; G09G 2300/0426; G09G 2380/02; G09G 2300/0421;
(Continued)

(56) References Cited

U.S. PATENT DOCUMENTS 7,443,096 B2 10/2008 Kobayashi
8,791,455 B2 7/2014 Kim et al.
(Continued)

FOREIGN PATENT DOCUMENTS

CN 1479270 A 3/2004
CN 201408604 Y 2/2010
(Continued)

OTHER PUBLICATIONS

China National Intellectual Property Administration, Office Action, CN Patent Application No. 201810442552.6, Dec. 24, 2021, 24 pages.

(Continued)

*Primary Examiner* — Sue A Purvis
*Assistant Examiner* — Aneta B Cieslewicz
(74) *Attorney, Agent, or Firm* — Fenwick & West LLP

(57) ABSTRACT

Provided is a display device including: a substrate including an active area, a non-active area, a bending area and a pad area; the active area including pixels to display images, each pixel including an organic light emitting layer and a thin-film transistor (TFT); the non-active area located between the active area and the bending area; and the bending area configured to be bent and located between the non-active area and the pad area, the bending area including a signal line and a power line that are made of a same material as a source electrode or a drain electrode of the TFT in the active area.

20 Claims, 10 Drawing Sheets

Related U.S. Application Data continuation of application No. 15/808,482, filed on Nov. 9, 2017, now Pat. No. 10,679,567, which is a continuation of application No. 15/699,562, filed on Sep. 8, 2017, now Pat. No. 10,692,442, which is a continuation of application No. 14/572,232, filed on Dec. 16, 2014, now Pat. No. 9,786,229.

(51) Int. Cl.

| | |
|---|---|
| ***G09G 3/3266*** | (2016.01) |
| ***G09G 3/3275*** | (2016.01) |
| ***G09G 3/3291*** | (2016.01) |
| ***H10K 59/12*** | (2023.01) |
| ***H10K 59/131*** | (2023.01) |
| ***H10K 59/80*** | (2023.01) |
| ***H10K 71/60*** | (2023.01) |
| ***H10K 77/10*** | (2023.01) |
| ***H10K 102/00*** | (2023.01) |

(52) U.S. Cl.

CPC ......... *G09G 3/3291* (2013.01); *H10K 59/131* (2023.02); *H10K 59/805* (2023.02); *H10K 77/111* (2023.02); *G09G 3/035* (2020.08); *G09G 2300/0426* (2013.01); *G09G 2380/02* (2013.01); *H10K 59/1201* (2023.02); *H10K 71/60* (2023.02); *H10K 2102/311* (2023.02); *H10K 2102/341* (2023.02); *Y02E 10/549* (2013.01); *Y02P 70/50* (2015.11)

(58) Field of Classification Search

CPC ....... G09G 3/3208–3291; G09G 3/035; G09G 3/3266; G09G 3/3275; H10K 59/131; H10K 77/111; H10K 2102/311; H10K 2102/341; H10K 50/805–828; H10K 59/805–80524; H10K 59/1201; H10K 71/00; H10K 71/60; H10K 77/11; H01L 2251/5369; H01L 2251/5338; H01L 51/5203; H01L 51/0097; H01L 27/3276; Y02E 10/549; Y02P 70/50

See application file for complete search history.

(56) References Cited

U.S. PATENT DOCUMENTS

| | | | | |
|---|---|---|---|---|
| 10,229,938 | B2 | 3/2019 | Zhang et al. | |
| 2001/0017372 | A1 | 8/2001 | Koyama | |
| 2003/0027369 | A1 | 2/2003 | Yamazaki | |
| 2005/0184654 | A1 | 8/2005 | Kobayashi | |
| 2006/0044237 | A1 | 3/2006 | Lee et al. | |
| 2006/0123293 | A1 | 6/2006 | Kim et al. | |
| 2006/0170342 | A1 | 8/2006 | Kim et al. | |
| 2007/0200842 | A1* | 8/2007 | Tokuda | H10K 59/1315 345/204 |
| 2008/0198104 | A1* | 8/2008 | Yamashita | H10K 59/1216 345/77 |
| 2010/0277443 | A1 | 11/2010 | Yamazaki et al. | |
| 2010/0321624 | A1 | 12/2010 | Yanagisawa | |
| 2011/0007042 | A1 | 1/2011 | Miyaguchi | |
| 2012/0062447 | A1 | 3/2012 | Tseng et al. | |
| 2013/0002583 | A1 | 1/2013 | Jin et al. | |
| 2013/0299789 | A1 | 11/2013 | Yamazaki et al. | |
| 2013/0335365 | A1 | 12/2013 | Kim et al. | |
| 2014/0042406 | A1 | 2/2014 | Degner et al. | |
| 2014/0049449 | A1 | 2/2014 | Park et al. | |
| 2014/0132487 | A1* | 5/2014 | Park | H10K 59/88 345/55 |
| 2014/0139510 | A1* | 5/2014 | Han | G09G 3/3233 345/82 |
| 2014/0152633 | A1* | 6/2014 | Park | G09G 3/3291 345/207 |
| 2014/0176622 | A1* | 6/2014 | Jung | G09G 3/3233 345/76 |
| 2014/0217373 | A1* | 8/2014 | Youn | H10K 59/805 438/23 |
| 2014/0254111 | A1 | 9/2014 | Yamazaki et al. | |
| 2015/0041769 | A1* | 2/2015 | Kim | H10K 59/124 257/40 |
| 2015/0090990 | A1 | 4/2015 | Tsuruoka | |
| 2016/0035747 | A1 | 2/2016 | Zhang et al. | |

FOREIGN PATENT DOCUMENTS

| | | | |
|---|---|---|---|
| CN | 102855822 | A | 1/2013 |
| CN | 103337491 | A | 10/2013 |
| CN | 103474435 | A | 12/2013 |
| EP | 1918997 | A2 | 5/2008 |
| JP | 2001-100657 | A | 4/2001 |
| JP | 2001-134214 | A | 5/2001 |
| KR | 10-2005-0083008 | A | 8/2005 |
| KR | 10-2006-0036623 | A | 5/2006 |
| KR | 10-0770832 | B1 | 10/2007 |
| KR | 10-2011-0067448 | A | 6/2011 |
| KR | 10-2013-0004085 | A | 1/2013 |
| KR | 10-2013-0125715 | A | 11/2013 |
| KR | 10-1337253 | B2 | 12/2013 |

OTHER PUBLICATIONS

China National Intellectual Property Administration, First Office Action, CN Patent Application No. 201810052134.6, Aug. 5, 2019, 15 pages.

Korean Intellectual Property Office, Notification of Reasons for Refusal, KR Patent Application No. 10-2013-0169271, Dec. 19, 2019, 11 pages.

United States Office Action, U.S. Appl. No. 14/572,232, Dec. 29, 2016, 17 pages.

United States Office Action, U.S. Appl. No. 14/572,232, Jun. 16, 2016, 17 pages.

United States Office Action, U.S. Appl. No. 15/699,562, Sep. 25, 2019, 29 pages.

United States Office Action, U.S. Appl. No. 15/699,562, Mar. 28, 2019, 24 pages.

United States Office Action, U.S. Appl. No. 15/808,482, Mar. 26, 2019, 23 pages.

United States Office Action, U.S. Appl. No. 15/808,482, Sep. 25, 2019, nine pages.

United States Office Action, U.S. Appl. No. 16/849,974, Jun. 1, 2021, 22 pages.

China National Intellectual Property Administration, Second Office Action, CN Patent Application No. 201810442552.6, Jun. 6, 2022, 21 pages.

* cited by examiner

DISPLAY DEVICE

CROSS-REFERENCE TO RELATED APPLICATION

This application is a continuation application of U.S. patent application Ser. No. 16/849,974 filed on Apr. 15, 2020, which is a continuation application of U.S. patent application Ser. No. 15/808,482 filed on Nov. 9, 2017 (now U.S. Pat. No. 10,679,567 issued on Jun. 9, 2020), which is a continuation application of U.S. patent application Ser. No. 15/699,562 filed on Sep. 8, 2017 (now U.S. Pat. No. 10,692,442 issued on Jun. 23, 2020), which is a continuation application of U.S. patent application Ser. No. 14/572,232 filed on Dec. 16, 2014 (now U.S. Pat. No. 9,786,229 issued on Oct. 10, 2017), which claims the benefit under 35 U.S.C. 119(a) to Korean Patent Application No. 10-2013-0169271, filed on Dec. 31, 2013, all of which are hereby expressly incorporated by reference into the present application.

BACKGROUND OF THE DISCLOSURE

Field of the Disclosure

The present disclosure relates to a display device, and particularly, to a display device capable of preventing disconnection or short-circuiting of wires that may occur at a bending area during a bending process for a minimized bezel width, in an organic light-emitting diode display manufactured using a flexible substrate.

Description of the Related Art

Among flat panel display devices proposed to replace the conventional cathode ray tube, an organic light-emitting diode (OLED) display has a characteristic that a light-emitting diode provided at a display panel has high brightness and a low operation voltage. Such OLED display has advantages that a contrast ratio is large because it is a spontaneous light-emission type, and a very thin display can be implemented. The OLED display can easily implement moving images because a response time is several micro seconds (μs). Further, the OLED display has an unlimited viewing angle, and is stably operated even at a low temperature.

In the OLED display device, display devices are formed on a substrate such as glass. Recently, a flexible organic light-emitting diode (OLED) display device, which is capable of maintaining a display function even when rolled (or bent) like paper due to its flexible material such as plastic or metal foil rather than a non-flexible substrate, has been developed.

FIG. 1 is a planar view schematically illustrating a flexible organic light-emitting diode (OLED) display device in accordance with the conventional art, and FIG. 2A is an enlarged view of part 'A' in FIG. 1.

Referring to FIGS. 1 and 2A, the conventional flexible OLED display device 1 is formed on a flexible substrate 10 including an active area (A/A) and a non-active area (N/A).

The active area (A/A) is a region where an image is substantially displayed. A plurality of pixels (P) are arranged in the active area (A/A), in the form of matrices. Each of the pixels (P) includes a switching transistor (ST1), a driving transistor (DT), a sensing transistor (ST2), a capacitor (C), and an organic light-emitting diode (OLED).

The switching transistor (ST1) of the pixel (P) is connected to a gate line (GL) and a data line (DL) which are formed in the active area (A/A) so as to cross each other. The driving transistor (DT) is connected to a driving voltage line 14*b* for supplying a driving voltage (VDD) to the pixel (P) in the active area (A/A). The sensing transistor (ST2) is connected to a reference voltage line 14*a* for supplying a reference voltage (Vref) to the pixel (P) in the active area (A/A).

The non-active area (N/A) is a region formed around the active area (A/A), and is covered by a bezel portion, etc. Driving circuitry for driving the pixels (P) in the active area (A/A) and wires may be formed in the non-active area (N/A).

The driving circuitry includes a data driving portion 20, a gate driving portion 13 and a light-emitting controller (not shown). The data driving portion 20 is mounted at a lower end non-active area (N/A) in the form of a chip. The gate driving portion 13 and the light-emitting controller are formed at one or more sides of the non-active area (N/A), in the form of a gate in panel (GIP).

Wires include power lines 14*a*-14*c*, and signal lines GSL, DSL. The power lines 14*a*-14*c* includes a driving voltage line 14*a*, a reference voltage line 14*b* and a ground line 14*c*. Also, the signal lines GSL, DSL include a gate signal line (GSL), a data signal line (DSL) and a light-emitting signal line (not shown).

The driving voltage line 14*a* outputs a driving voltage (VDD) provided from the data driving portion 20 to the pixel (P) in the active area (A/A). The reference voltage line 14*b* outputs a reference voltage (Vref) provided from the data driving portion 20 to the pixel (P) in the active area (A/A). The ground line 14*c* outputs a ground voltage (GND) provided from the data driving portion 20 to the pixel (P) in the active area (A/A).

The driving voltage line 14*a*, the reference voltage line 14*b* and the ground line 14*c* include a region vertically extending from the data driving portion in the lower end non-active area (N/A), and a region formed in parallel to the data driving portion 20.

That is, the driving voltage line 14*a*, the reference voltage line 14*b* and the ground line 14*c* are extending from the data driving portion 20 in a vertical direction, at a region adjacent to the data driving portion 20 in the lower end non-active area (N/A). The driving voltage line 14*a*, the reference voltage line 14*b* and the ground line 14*c* are formed as bars, in parallel to the data driving portion 20, at a region adjacent to the active area (A/A) in the lower end non-active area (N/A).

The gate signal line (GSL) outputs a gate signal provided from the data driving portion 20 to the gate driving portion 13. The data signal line (DSL) outputs a data signal provided from the data driving portion 20 to the data line (DL) in the active area (A/A). The light-emitting signal line outputs a light-emitting signal provided from the data driving portion 20 to the light-emitting controller.

In accordance with one embodiment, these wires may be formed to cross each other at least once, in the lower end non-active area (N/A). Thus, the power lines 14*a*-14*c* and the signal lines GSL, DSL are formed on different layers, in order to prevent short-circuiting when the wires cross each other.

In the conventional flexible OLED display device 1, the lower end non-active area (N/A) is formed to have a larger width than the rest of the non-active area (N/A). A bending area (B/A) is formed in the lower end non-active area (N/A), and part of the lower end non-active area (N/A) is bent to a rear surface of the flexible OLED display device 1. Under such configuration, the width of the lower end non-active area (N/A) can be reduced.

FIG. 2B is a cross-sectional view of the flexible OLED display device of FIG. 1, which illustrates a bent state.

Referring to FIG. 2B, reference numeral 11 denotes an organic light-emitting diode (OLED) formed in an active area (A/A), and reference numeral 12 denotes an encapsulation layer for encapsulating an OLED.

Referring to FIG. 2B, in the conventional flexible OLED display device 1, the lower end non-active area (N/A) is bent based on a bending area (B/A), so that part of the lower end non-active area (N/A) can be positioned on a rear surface of the flexible OLED display device 1. A curvature radius (R) of the bending area (B/A) is about 0.3 mm.

As mentioned above with reference to FIG. 2A, in the lower end non-active area (N/A) of the conventional flexible OLED display device 1, wires are formed to cross each other. Thus, the power lines 14*a*-14*c* and the signal lines GSL, DSL are formed on different layers.

However, because the wires are formed to cross each other even in the bending area (B/A), the wires may be disconnected from each other due to bending stress in the bending area (B/A).

FIG. 3 is a cross-sectional view taken along line III-III' in FIG. 2A.

Referring to FIG. 3, the signal lines GSL, DSL and the power lines 14*a*-14*b* are formed on different layers to thus be insulated from each other.

For instance, a gate signal line (GSL) and a data signal line (DSL) are formed on a flexible substrate 10 with a distance therebetween. A first insulating layer 15 is formed on the gate signal line (GSL) and the data signal line (DSL).

A driving voltage line 14*a* and a reference voltage line 14*b* are formed on the first insulating layer 15 with a predetermined gap therebetween. For instance, the reference voltage line 14*a* is formed to overlap the gate signal line (GSL). A second insulating layer 16 is formed on the driving voltage line 14*a* and the reference voltage line 14*b*.

When the bending area (B/A) is bent with more than a predetermined curvature radius, cracks/breaks may occur at wires due to bending stress. This may cause the wires to be disconnected from each other, or the insulating layer may be damaged to cause short-circuiting of the wires.

Such disconnection or short-circuiting of the wires may cause a malfunction of the flexible OLED display device 1.

SUMMARY OF THE DISCLOSURE

Therefore, an aspect of the detailed description is to provide a display device capable of preventing disconnection or short-circuiting of wires, by forming wires in a bending area of a non-active area, on the same layer so as not to cross each other.

To achieve these and other advantages and in accordance with the purpose of this specification, as embodied and broadly described herein, there is provided a display device, including: a substrate including an active area, a non-active area, a bending area and a pad area; the active area including pixels to display images, each pixel including an organic light emitting layer and a thin-film transistor (TFT); the non-active area located between the active area and the bending area; and the bending area configured to be bent and located between the non-active area and the pad area, the bending area including a signal line and a power line that are made of a same material as a source electrode or a drain electrode of the TFT in the active area.

To achieve these and other advantages and in accordance with the purpose of this specification, as embodied and broadly described herein, there is also provided a display device, including: a substrate including an active area, a non-active area, a bending area and a pad area; the active area including pixels to display images, each pixel including an organic light emitting layer; the bending area being bent and located between the active area and the pad area, and the bending area including a first power line and a first signal line that are on a same layer; and the non-active area located between the active area and the bending area, and including a second power line and a second signal line, wherein at least one among the second power line and the second signal line is connected to the first power line or the first signal line through a contact hole.

The present invention can have the following advantages.

In the bending area of the non-active area, wires are formed on the same layer in parallel to each other, so as not to overlap or cross each other. As a result, disconnection or short-circuit of the wires, which occurs when the bending area is bent, can be prevented. Thus a malfunction of the display device can be prevented.

Further scope of applicability of the present application will become more apparent from the detailed description given hereinafter. However, it should be understood that the detailed description and specific examples, while indicating preferred embodiments of the disclosure, are given by way of illustration only, since various changes and modifications within the spirit and scope of the disclosure will become apparent to those skilled in the art from the detailed description.

BRIEF DESCRIPTION OF THE DRAWINGS

The accompanying drawings, which are included to provide a further understanding of the disclosure and are incorporated in and constitute a part of this specification, illustrate exemplary embodiments and together with the description serve to explain the principles of the disclosure.

In the drawings.

DETAILED DESCRIPTION OF EMBODIMENTS

Description will now be given in detail of the exemplary embodiments of the present invention, with reference to the accompanying drawings. For the sake of brief description with reference to the drawings, the same or equivalent components will be provided with the same reference numbers, and description thereof will not be repeated.

Hereinafter, a display device according to the present invention will be explained in more detail.

Figure 1:
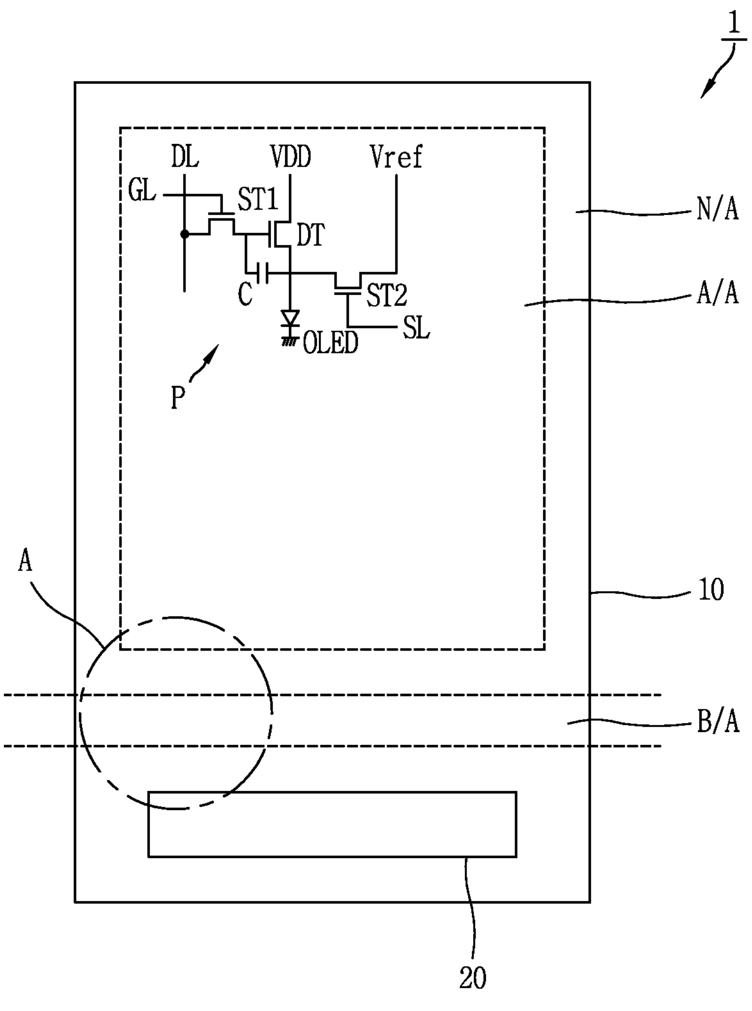
FIG. 1 is a planar view schematically illustrating a flexible organic light-emitting diode (OLED) display device in accordance with the related art.
Figure 2A:
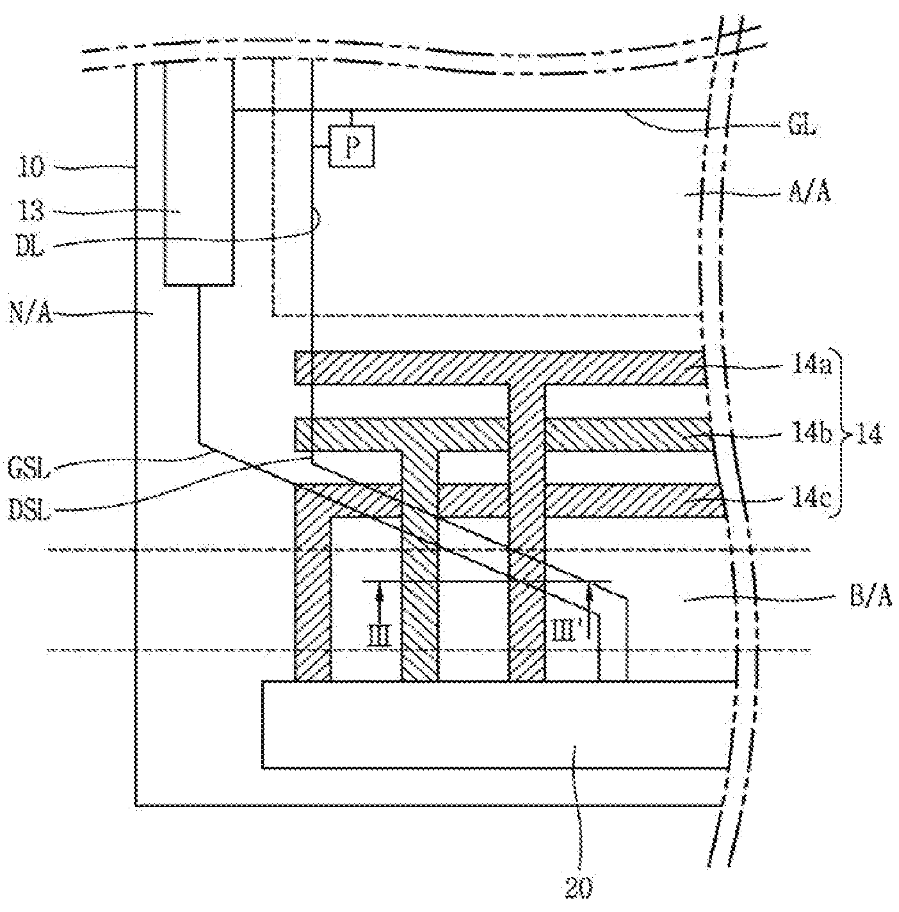
FIG. 2A is an enlarged view of part 'A' in FIG. 1.
Figure 2B:
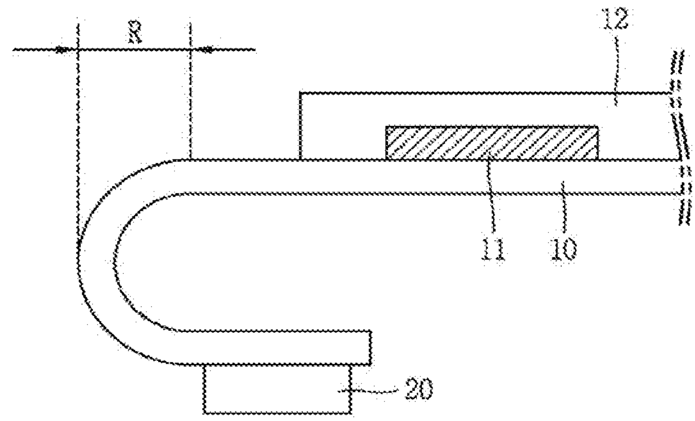
FIG. 2B is a cross-sectional view of the flexible OLED display device of FIG. 1, which illustrates a bent state.
Figure 3:
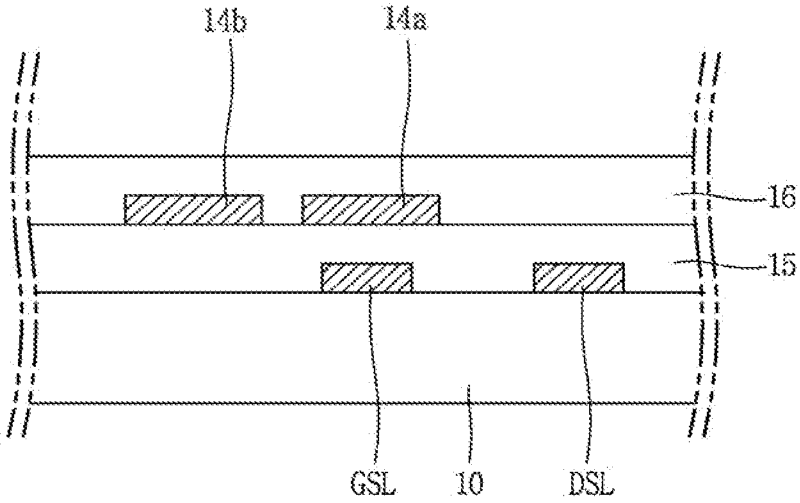
FIG. 3 is a cross-sectional view taken along line III-III' in FIG. 2B.
Figure 4:
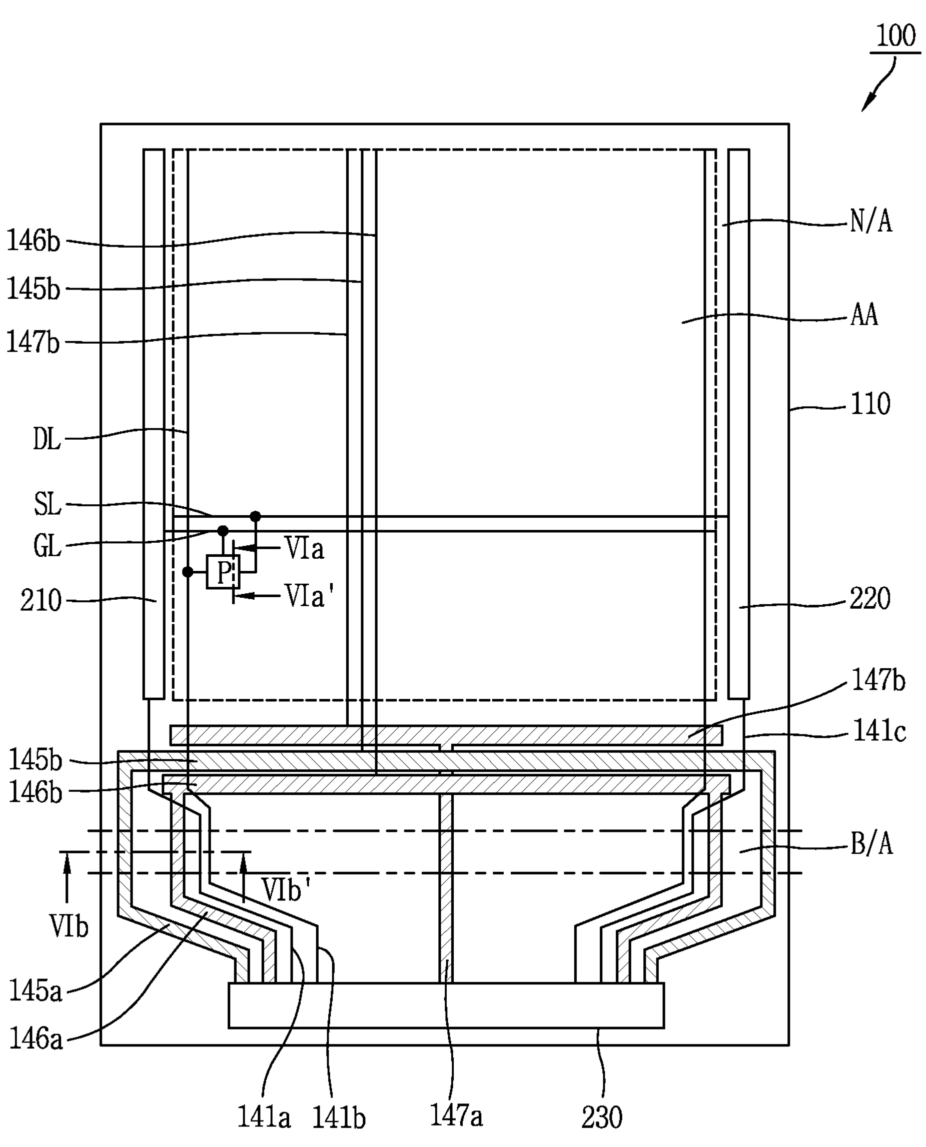
FIG. 4 is a planar view of a flexible OLED display device according to a first embodiment of the present invention.

FIG. 4 is a planar view of a flexible organic light-emitting diode (OLED) display device according to a first embodiment of the present invention.

Referring to FIG. 4, the flexible OLED display device 100 according to a first embodiment of the present invention may be formed on a flexible substrate 110 including an active area (display area) (A/A) and a non-active area (non-display area) (N/A).

The active area (A/A) is a region where an image is substantially displayed. On the active area (A/A), a plurality of gate lines (GL) and a plurality of data lines (DL) may be formed to cross each other, thereby defining pixel regions. A plurality of sensing lines (SL) may be formed in parallel to the plurality of gate lines (GL).

Power lines for supplying a driving voltage (VDD), a reference voltage (Vref) and a ground voltage (GND) to pixel regions, e.g., a driving voltage line 146*b*, a reference voltage line 147*b* and a ground line 145*b* may be formed in the active area (A/A).

A pixel (P) having a plurality of switching devices may be formed at the pixel region. The pixel (P) may operate by being connected to each of the gate line (GL), the data line (DL) and the sensing line (SL).

Figure 5:
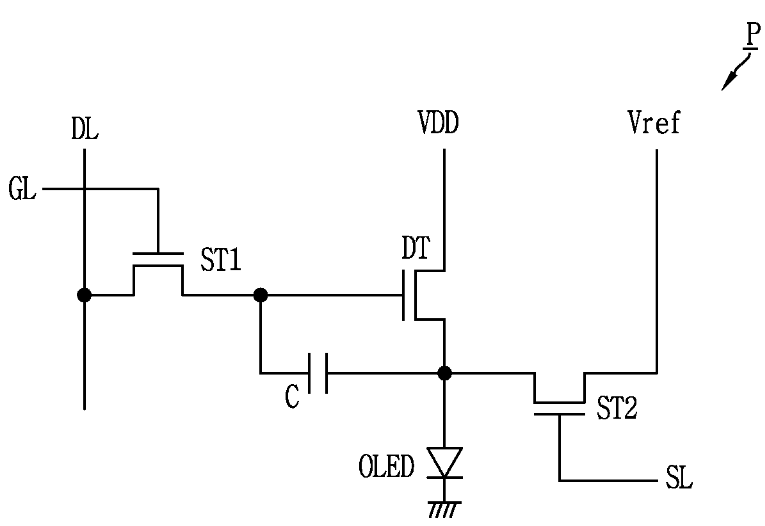
FIG. 5 is an equivalent circuit diagram for a single pixel in the flexible OLED display device of FIG. 4.

FIG. 5 is an equivalent circuit diagram for a single pixel in the flexible OLED display device of FIG. 4.

Referring to FIGS. 4 and 5, the pixel (P) in the active area (A/A) may have a structure where three switching devices (ST1, DT, ST2), one capacitor (C) and one organic light emitting diode (OLED) are formed. However, the present invention is not limited to this configuration. That is, the pixel (P) may be formed to have various structures such as 2T1C, 4T1C, 5T1C and 6T1C.

The switching devices (ST1, DT, ST2) may include a switching transistor (ST1), a driving transistor (DT) and a sensing transistor (ST2). The switching device (ST1, DT, ST2) may be thin film transistors (TFT), for example, formed of amorphous silicon or poly-crystalline silicon.

The switching transistor (ST1) of the pixel (P) may include a gate electrode connected to the gate line (GL) of the active area (A/A), a source electrode connected to the data line (DL), and a drain electrode connected to the driving transistor (DT). The switching transistor (ST1) may output a data signal supplied from the data line (DL) to the driving transistor (DT), according to a gate signal supplied from the gate line (GL).

The driving transistor (DT) of the pixel (P) may include a gate electrode connected to the drain electrode of the switching transistor (ST1), a source electrode connected to an OLED, and a drain electrode connected to driving voltage lines 146*a*, 146*b* for supplying a driving voltage (VDD). The driving transistor (DT) may control the size of current applied to the OLED from the driving voltage (VDD), according to a data signal supplied from the switching transistor (ST1).

The capacitor (C) of the pixel (P) may be connected between the gate electrode of the driving transistor (DT) and the OLED. The capacitor (C) may store therein a voltage corresponding to a data signal supplied to the gate electrode of the driving transistor (DT). Also, the capacitor (C) may constantly maintain an 'ON' state of the driving transistor (DT) for a single frame, with the voltage stored therein.

The sensing transistor (ST2) of the pixel (P) may include a gate electrode connected to the sensing line (SL), a source electrode connected to the source electrode of the driving transistor (DT), and a drain electrode connected to reference voltage lines 147*a*, 147*b* for supplying a reference voltage (Vref). The sensing transistor (ST2) may sense a threshold voltage (Vth) of the driving transistor (DT), thereby preventing a malfunction of the OLED.

The switching transistor (ST1) of the pixel (P) may be turned on by a gate signal supplied to the gate line (GL), and the capacitor (C) of the pixel (P) may be charged with charges by a data signal supplied to the data line (DL). The amount of current applied to the channel of the driving transistor (DT) may be determined according to a potential difference between a voltage charged at the capacitor (C) and the driving voltage (VDD). The amount of light emitted from the OLED may be determined based on such amount of current. As the OLED emits light, an image is displayed.

The sensing transistor (ST2) may be turned on earlier than the switching transistor (ST1), according to a sensing signal supplied through the sensing line (SL). Under such configuration, electroluminescence of the OLED by the driving voltage (EVDD), which occurs before a data signal is charged at the capacitor (C) during an initial operation of the switching transistor (ST1), can be prevented.

Referring back to FIG. 4, the non-active area (N/A) of the flexible OLED display device 100 may be formed adjacent, for example, around the active area (A/A). Driving circuitry for driving the pixels (P) in the active area (A/A) and wires may be formed in the non-active area (N/A).

The driving circuitry may include a data driving portion 230, a gate driving portion 210 and a light-emitting controller 220.

The data driving portion 230 may be mounted at the non-active area (N/A) below the active area (A/A), in the form of a chip. The data driving portion 230 may generate a data signal by receiving a signal from an external printed circuit board (not shown). The generated data signals may be output to the plurality of data lines (DL) in the active area (A/A) through wires.

The data driving portion 230 may output a gate signal and a light-emitting signal provided from external circuitry, to the gate driving portion 210 and the light-emitting controller 220 through wires, respectively. The data driving portion 230 may output power signals provided from external circuitry, e.g., power signals including a driving voltage (VDD), a reference voltage (Vref), a ground voltage (GND), etc., to driving voltage lines 146*a*, 146*b*, reference voltage lines 147*a*, 147*b*, and ground lines 145*a*, 145*b*, respectively.

The gate driving portion 210 may be formed at one side of the non-active area (N/A) outside the active area (A/A), in the form of a gate in panel (GIP). The gate driving portion 210 may sequentially output gate signals provided from the data driving portion 230 through wires (e.g., gate signal lines 141*a*), to the plurality of gate lines (GL) in the active area (A/A).

The light-emitting controller 220 may be formed at another side of the non-active area (N/A) outside the active area (A/A), in the form of a gate in panel (GIP) so as to correspond to the gate driving portion 210. The light-emitting controller 220 may sequentially output light-emitting signals provided from the data driving portion 230 through wires (e.g., light-emitting lines 141*c*), to the plurality of sensing lines (SL) in the active area (A/A).

The wires may include power lines and signal lines formed between the data driving portion 230 and the active area (A/A). The power lines may include driving voltage lines 146*a*, 146*b*, reference voltage lines 147*a*, 147*b*, and ground lines 145*a*, 145*b*. Also, the signal lines may include a gate signal line 141*a*, a data signal line 141*b*, and a light-emitting signal line 141*c*.

The power lines may supply power signals provided from the data driving portion 230, to the active area (A/A). The signal lines may supply driving signals provided from the data driving portion 230, e.g., a gate signal, a data signal and a light-emitting signal, to the active area (A/A), the gate driving portion 210 and the light-emitting controller 220.

The driving voltage lines 146*a*, 146*b* may be formed in the lower end non-active area (N/A), and may output a driving voltage (VDD) provided from the data driving portion 230 to the pixel (P) in the active area (A/A).

The driving voltage lines 146*a*, 146*b* may include a first driving voltage line 146*a* and a second driving voltage line 146*b*. The first driving voltage line 146*a* connected to the data driving portion 230. The second driving voltage line 146*b* may be connected to the first driving voltage line 146*a* and formed as a bar in a direction parallel to the data driving portion 230. The second driving voltage line 146*b* may be formed such that one side thereof is connected to the first driving voltage line 146*a*, and another side thereof is extending to the pixel (P) in the active area (A/A). Based on this configuration, the second driving voltage line 146*b* may output a driving voltage (VDD) provided through the first driving voltage line 146*a* to each pixel (P).

The reference voltage lines 147*a*, 147*b* may be formed in the lower end non-active area (N/A), and may output a reference voltage (Vref) provided from the data driving portion 230 to the pixel (P) in the active area (A/A).

The reference voltage lines 147*a*, 147*b* may include a first reference voltage line 147*a* and a second reference voltage line 147*b*. The first reference voltage line 147*a* connected to the data driving portion 230. The second reference voltage line 147*b* may be connected to the first reference voltage line 147*a* and formed as a bar in parallel to the second driving voltage line 146*b*. The second reference voltage line 147*b* may be formed such that one side thereof is connected to the first reference voltage line 147*a*, and another side thereof is extending to the pixel (P) in the active area (A/A). Based on this configuration, the second reference voltage line 147*b* may output a reference voltage (Vref) provided through the first reference voltage line 147*a* to each pixel (P).

The ground lines 145*a*, 145*b* may be formed in the lower end non-active area (N/A), and may output a ground voltage (GND) provided from the data driving portion 230 to the pixel (P) in the active area (A/A).

The ground lines 145*a*, 145*b* may include a first ground line 145*a* and a second ground line 145*b*. The first ground line 145*a* connected to the data driving portion 230. The second ground line 145*b* may be connected to the first ground line 145*a*, and formed as a bar in parallel to the second driving voltage line 146*b* and the second reference voltage line 147*b*. The second ground line 145*b* may be formed such that one side thereof is connected to the first ground line 145*a*, and another side thereof is extending to the pixel (P) in the active area (A/A). By this configuration, the second ground line 145*b* may output a ground voltage (GND) provided through the first ground line 145*a* to each pixel (P).

The gate signal line 141*a* may be formed between the data driving portion 230 and the gate driving portion 210 in the lower end non-active area (N/A). The gate signal line 141*a* may output a gate signal provided from the data driving portion 230 to the gate driving portion 210. The gate signal may be output to the plurality of gate lines (GL) in the active area (A/A), through the gate driving portion 210.

The data signal line 141*b* may be formed in the lower end non-active area (N/A), between the data driving portion 230 and the data line (DL) in the active area (A/A). The data signal line 141*b* may output a data signal provided from the data driving portion 230 to the plurality of data lines (DL) in the active area (A/A).

The light-emitting signal line 141*c* may be formed in the non-active area (N/A) between the data driving portion 230 and the light-emitting controller 220. The light-emitting signal line 141*c* may output a light-emitting signal provided from the data driving portion 230, to the light-emitting controller 220. The light-emitting signal may be output to the plurality of sensing lines (SL) in the active area (A/A), by the light-emitting controller 220.

In the flexible OLED display device 100 according to this embodiment of the present invention, the lower end non-active area (N/A) may include a bending area (B/A). The bending area (B/A) may be a region which has a predetermined curvature when part of the lower end non-active area (N/A) is bent to the rear or front surface of the flexible OLED display device 100. That is, the bending area (B/A) is a flexible portion including flexible materials that is provided between one end of the display device 100 and the other part of the device 100 and allows the one end to be bent or rotated around the bending area (B/A) toward the front or rear surface of the other part. In accordance with one embodiment, the lower end non-active area (N/A) may be bent around the bending area (B/A) toward the front or rear surface of the flexible OLED display device 100. As an example, the lower end non-active area (N/A) may be attached to the rear surface of the flexible OLED display device 100 by the rotation around the bending area (B/A). Although FIG. 4 shows only one bending area formed adjacent one end of the flexible OLED display device 100, it will be readily appreciable to one skilled in the art that the bending area (B/A) may be formed adjacent any side of the flexible OLED display device 100 (e.g. 4 bending areas formed adjacent 4 sides of the flexible OLED display device 100 in rectangular shape).

The lower end non-active area (N/A) may be divided into three regions by the bending area (B/A). For instance, the lower end non-active area (N/A) may be divided into a first area between the bending area (B/A) and the active area (A/A), the bending area (B/A), and a second area between the bending area (B/A) and an area where the data driving portion 230 has been mounted.

The first area of the lower end non-active area (N/A) may be a region covered by a bezel portion, etc., together with the rest of the non-active area (N/A). Also, the second area may be a region that may be positioned on a rear surface of the flexible OLED display device 100, by bending of the bending area (B/A).

Power lines, which include the second driving voltage line 146*b*, the second reference voltage line 147*b* and the second ground line 145*b*, may be formed in the first area of the lower end non-active area (N/A).

Signal lines, which include the gate signal line 141*a*, the data signal line 141*b* and the light-emitting signal line 141*c*, may be formed in the first area so as to cross the power lines. The signal lines and the power lines in the first area may be formed to overlap each other at different layers on the flexible substrate 110.

Power lines, which include the first driving voltage line 146*a*, the first reference voltage line 147*a* and the first ground line 145*a*, may be formed in the bending area (B/A) of the lower end non-active area (N/A).

Signal lines, which include the gate signal line 141*a*, the data signal line 141*b* and the light-emitting signal line 141*c*, may be formed in the bending area (B/A) in parallel to the power lines so as not to cross the power lines. The signal lines and the power lines in the bending area (B/A) may be formed to be spaced from each other on the same layer on the flexible substrate 110.

The power lines, which include the first driving voltage line 146*a*, the first reference voltage line 147*a* and the first ground line 145*a*, may be formed in the second area of the lower end non-active area (N/A).

The signal lines, which include the gate signal line 141*a*, the data signal line 141*b* and the light-emitting signal line 141*c*, may be formed in the second area in parallel to the power lines so as not to cross the power lines. The signal lines and the power lines may be formed to be extending from the data driving portion 230 in parallel to each other. In this case, the signal lines and the power lines may be formed to be in parallel to each other by being bent at least twice in the second area. The signal lines and the power lines in the second area may be formed to be spaced from each other on the same layer.

As mentioned above, in the flexible OLED display device 100 according to this embodiment, wires are formed on the same layer in parallel to each other, in the bending area (B/A) of the lower end non-active area (N/A) where bending is performed. Accordingly, unlike in the conventional art, the occurrence of disconnection of the wires due to bending stress can be prevented.

In the second area and the bending area (B/A) of the lower end non-active area (N/A), wires are formed on the same layer. However, in the first area, wires are formed on different layers. By such configuration, wires formed in the bending area (B/A) may be connected to wires formed on different layers in the first area, through holes (not shown).

Figure 6:
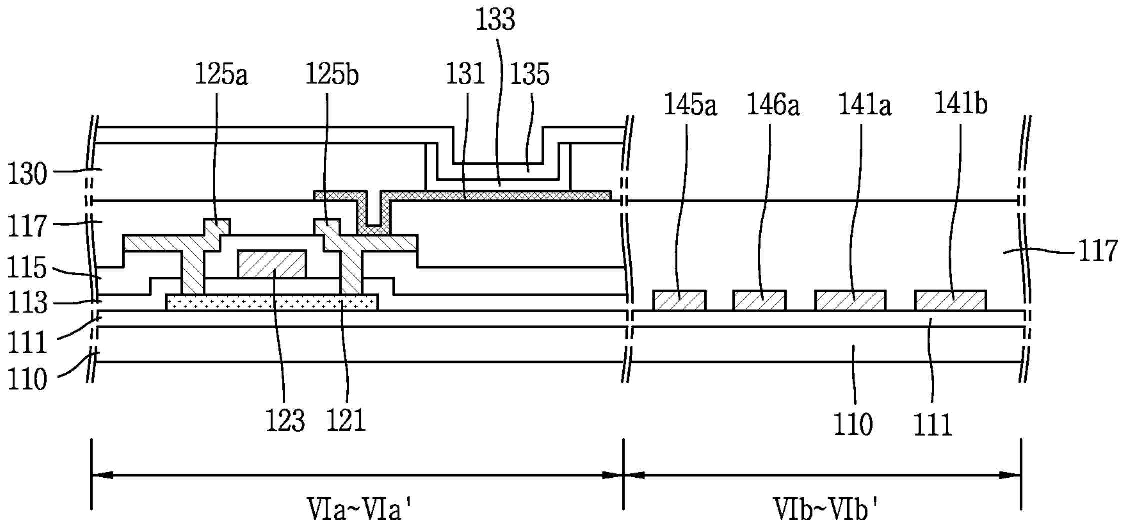
FIG. 6 is a cross-sectional view taken along line VIa-VIa' and VIb-VIb' in the flexible OLED device of FIG. 4.

FIG. 6 is a cross-sectional view taken along line VIa~VIa' and VIb~VIb' in the flexible OLED device of FIG. 4.

Referring to FIGS. 4 and 6, the flexible OLED display device 100 may include pixels (P) formed in the active area (A/A), and wires formed in the non-active area (N/A) (e.g., lower end non-active area (N/A)). The lower end non-active area (N/A) where wires have been formed may be the bending area (B/A).

A thin film transistor (TFT) and an organic light emitting diode (OLED) may be formed on the flexible substrate 110 in the active area (A/A).

For instance, a passivation layer 111 may be formed on the entire surface of the flexible substrate 110. A semiconductor layer 121 formed of amorphous or poly-crystalline silicon may be formed on the passivation layer 111.

A gate insulating layer 113 may be formed on the semiconductor layer 121, and a gate electrode 123 may be formed on the gate insulating layer 113 at a position corresponding to a predetermined region of the semiconductor layer 121.

An interlayer insulating layer 115 may be formed on the gate electrode 123, and a source electrode 125*a* and a drain electrode 125*b* may be formed on the interlayer insulating layer 115.

The source electrode 125*a* and the drain electrode 125*b* may be connected to the semiconductor layer 121, through contact holes (not shown) formed at the interlayer insulating layer 115 and the gate insulating layer 113.

The semiconductor layer 121, the gate electrode 123, the source electrode 125*a* and the drain electrode 125*b* may constitute a thin film transistor in the active area (A/A) of the flexible substrate 110. The TFT may be, for example, a driving transistor of the flexible OLED display device 100. However, the present invention is not limited to this example.

A planarization layer 117 may be formed on the TFT. A first electrode 131, connected to the drain electrode 125*b* through a contact hole (not shown), may be formed on the planarization layer 117.

A pixel defining layer 130, through which part of the first electrode 131 is exposed to the outside, may be formed on the first electrode 131. A light-emitting layer 133 may be formed on the pixel defining layer 130. The light-emitting layer 133 may be formed on the first electrode 131 which has been exposed to the outside by the pixel defining layer 130. A second electrode 135 may be formed on the light-emitting layer 133.

The first electrode 131, the light-emitting layer 133 and the second electrode 135 may constitute an OLED in the active area (A/A) of the flexible substrate 110.

Signal lines and power lines may be formed on the flexible substrate 110 in the bending area (B/A). The signal lines may include the gate signal line 141*a* and the data signal line 141*b*. The power lines may include the first ground line 145*a* and the first driving voltage line 146*a*.

For instance, the passivation layer 111 may be formed on the entire surface of the flexible substrate 110. The gate signal line 141*a*, the data signal line 141*b*, the first ground line 145*a* and the first driving voltage line 146*a* may be formed commonly on the passivation layer 111, such that they are spaced from each other with a predetermined distance therebetween, for example, in parallel to each other.

In accordance with one embodiment, the signal lines and the power lines formed in the bending area (B/A) may be formed of the same metallic material as the source electrode 125*a* and the drain electrode 125*b* formed in the active area (A/A), at the same processing stage.

Like in the active area (A/A), the planarization layer 117 may be formed as an insulating layer on the signal lines and the power lines formed in the bending area (B/A).

As mentioned above, in the flexible OLED display device 100 according to one embodiment, wires may be formed on the same layer in the bending area (B/A), with the same metallic material. Accordingly, even if the planarization layer 117 is damaged by bending stress in the bending area (B/A), the wires in the bending area (B/A) are not disconnected or cracked. This can prevent a malfunction of the flexible OLED display device 100.

Figure 7A:
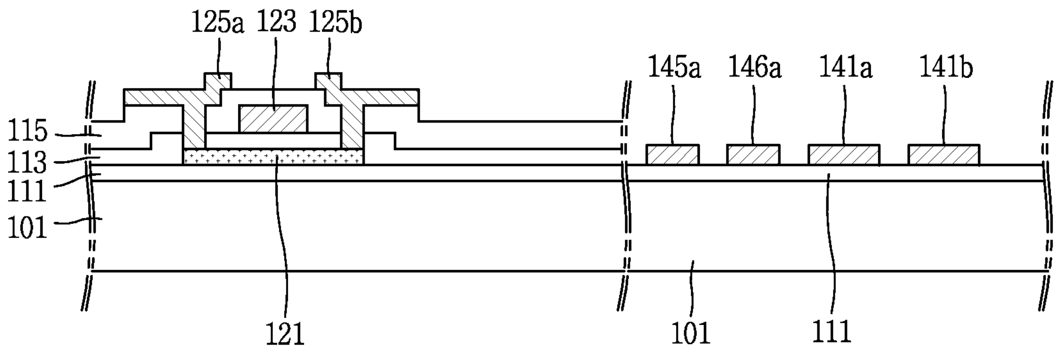
FIGS. 7A to 7C are views illustrating processes of fabricating a flexible OLED display device according to a second embodiment of the present invention.
Figure 7B:
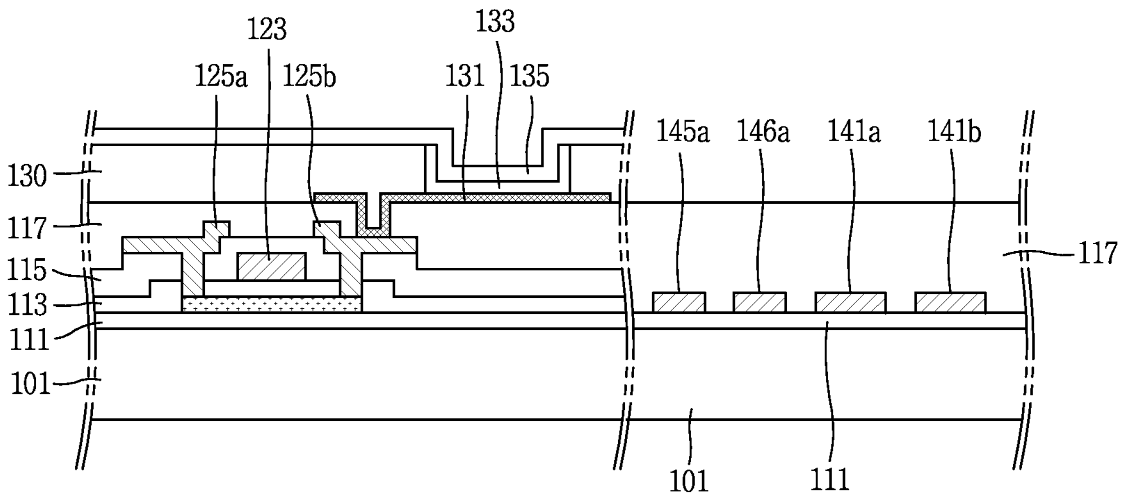
Figure 7C:
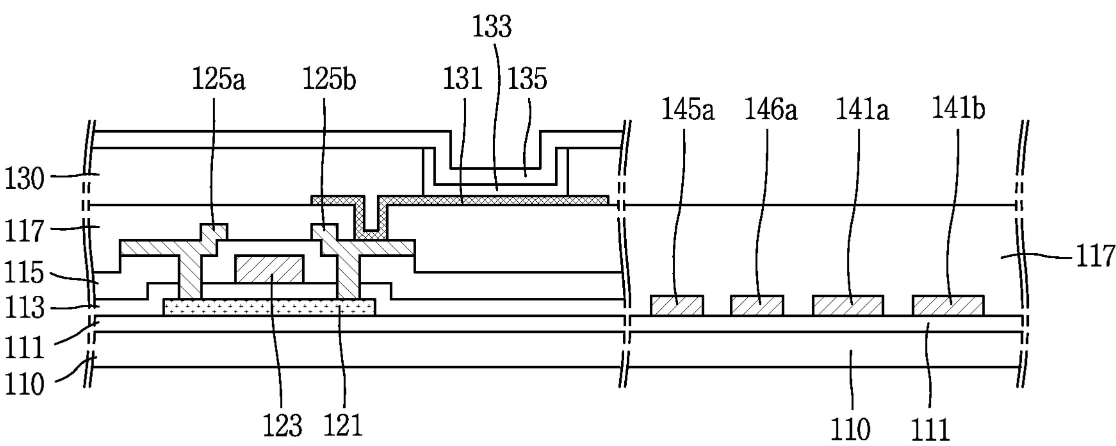

FIGS. 7A to 7C are views illustrating processes of fabricating a flexible OLED display device according to a second embodiment of the present invention.

A passivation layer 111 may be formed on the entire surface of a substrate divided into an active area (A/A) and a non-active area (N/A), e.g., a glass substrate 101. The passivation layer 111 is provided so that thin film transistors, organic light-emitting diodes and wires can be prevented from being damaged during the process of detaching the glass substrate 101, as described below in more detail.

The non-active area (N/A) may include a bending area (B/A) formed below the active area (A/A), i.e., a bending area (B/A) of a lower end non-active area (N/A).

Amorphous silicon or poly-crystalline silicon is deposited in the active area (A/A) on the glass substrate 101 where the passivation layer 111 has been formed. Then the amorphous silicon or the poly-crystalline silicon is selectively patterned, thereby forming a semiconductor layer 121. The semiconductor layer 121 may include a source region and a drain region each including impurities, and a channel region including no impurities.

A gate insulating layer 113 may be formed on the entire surface of the glass substrate 101 where the semiconductor layer 121 has been formed. The gate insulating layer 113 may be formed as a silicon oxide film (SiOx), a silicon nitride film (SiNx), or a multi-layer thereof.

The gate insulating layer 113 may not be formed in the non-active area (N/A) of the glass substrate 101.

A gate electrode 123 may be formed on the gate insulating layer 113, at a position corresponding to a channel region of the semiconductor layer 121. The gate electrode 123 may be formed by depositing a metallic material such as molybdenum (Mo), aluminum (Al), chrome (Cr), titanium (Ti) and copper (Cu), or an alloy thereof, on the gate insulating layer 113, and then by selectively patterning the metallic material or the alloy.

An interlayer insulating layer 115 may be formed on the entire surface of the active area (A/A) of the glass substrate 101 where the gate electrode 123 has been formed. The interlayer insulating layer 115 may be formed as a silicon oxide film (SiOx), a silicon nitride film (SiNx), or a multi-layer thereof.

Contact holes (not shown) may be formed by etching part of the interlayer insulating layer 115 and the gate insulating layer 113, thereby exposing part of the semiconductor layer 121, e.g., a source region and a drain region to the outside therethrough.

A source electrode 125*a* and a drain electrode 125*b* may be formed on the interlayer insulating layer 115. The source electrode 125*a* may be formed so as to be connected to the source region of the semiconductor layer 121 through the contact hole, and the drain electrode 125*b* may be formed so as to be connected to the drain region of the semiconductor layer 121 through the contact hole.

The source electrode 125*a* and the drain electrode 125*b* may be formed by depositing a metallic material such as Ti, Al and Mo, or an alloy thereof such as Ti/Al/Ti and Mo/Al, on the interlayer insulating layer 115, and then by selectively patterning the metallic material or the alloy.

A thin film transistor (TFT) including the semiconductor layer 121, the gate electrode 123, the source electrode 125*a* and the drain electrode 125*b*, which is, e.g., a driving transistor of the flexible OLED display device 100, may be formed in the active area (A/A) of the glass substrate 101.

Wires, e.g., a gate signal line 141*a*, a data signal line 141*b*, a first ground line 145*a* and a first driving voltage line 146*a* may be formed on the passivation layer 111, in the non-active area (N/A) of the glass substrate 101. Such wires may be formed on the passivation layer 111 so as to be spaced from each other with a predetermined interval.

The gate signal line 141*a*, the data signal line 141*b*, the first ground line 145*a* and the first driving voltage line 146*a* may be formed of the same metallic material as the source electrode 125*a* and the drain electrode 125*b*, at the same processing stage.

Referring to FIG. 7B, a planarization layer 117 may be formed on the entire surface of the active area (A/A) where a thin film transistor has been formed, and the non-active area (N/A) where wires have been formed.

The planarization layer 117 may be formed by a spin coating method, for example, the method for coating an organic material or an inorganic material such as polyimide, benzocyclobutene series resin and acrylate, in the form of a liquid phase, and then hardening the material.

A contact hole (not shown) may be formed by etching part of the planarization layer 117 in the active area (A/A), thereby exposing the drain electrode 125*b* to the outside therethrough.

A first electrode 131 may be formed on the planarization layer 117 in the active area (A/A). The first electrode 131 may be connected to the drain electrode 125*b* through the contact hole of the planarization layer 117.

The first electrode 131 may be formed of a transparent conductive material such as ITO (Indium Tin Oxide), IZO (Indium Zinc Oxide) or ZnO (Zinc Oxide), which may form the anode of an OLED.

A pixel defining layer 130 may be formed on the first electrode 131. The pixel defining layer 130 may have an opening through which part of the first electrode 131 is exposed to the outside, and may define a pixel region.

The pixel defining layer 130 may be formed by a spin coating method, for example, the method for coating an organic material or an inorganic material such as polyimide, benzocyclobutene series resin and acrylate, in the form of a liquid phase, and then hardening the material.

Referring to FIGS. 7B and 7C, a light-emitting layer 133 may be formed on the pixel defining layer 130. The light-emitting layer 133 may be formed on the opening of the pixel defining layer 130, i.e., may be formed on the first electrode 131 exposed to the outside by the pixel defining layer 130.

A second electrode 135 may be formed on the light-emitting layer 133. The second electrode 135 may be formed of aluminum (Al), silver (Ag), magnesium (Mg), or an alloy thereof by deposition.

An OLED including the first electrode 131, the light-emitting layer 133 and the second electrode 135 may be formed on a TFT of the glass substrate 101 in the active area (A/A).

When a TFT and an OLED have been formed in the active area (A/A) and wires have been formed in the non-active area (N/A), the glass substrate 101 may be detached from the passivation layer 111. Then, a flexible substrate 110 may be attached to the passivation layer 111.

The flexible substrate 110 may have the same active area (A/A) and non-active area (N/A) as the glass substrate 101.

The flexible substrate 110 may be formed, for example, of one of polycarbon, polyimide, polyether sulfone (PES), polyarylate, polyethylene naphthalate (PEN) or polyethyleneterephthalate (PET).

The glass substrate 101 may be detached from the passivation layer 111 through irradiation of laser, etc., and the flexible substrate 110 may be attached to the passivation layer 111 by an adhesive tape such as an optically clear adhesive (OCA), with reference to FIG. 7C.

Figure 8:
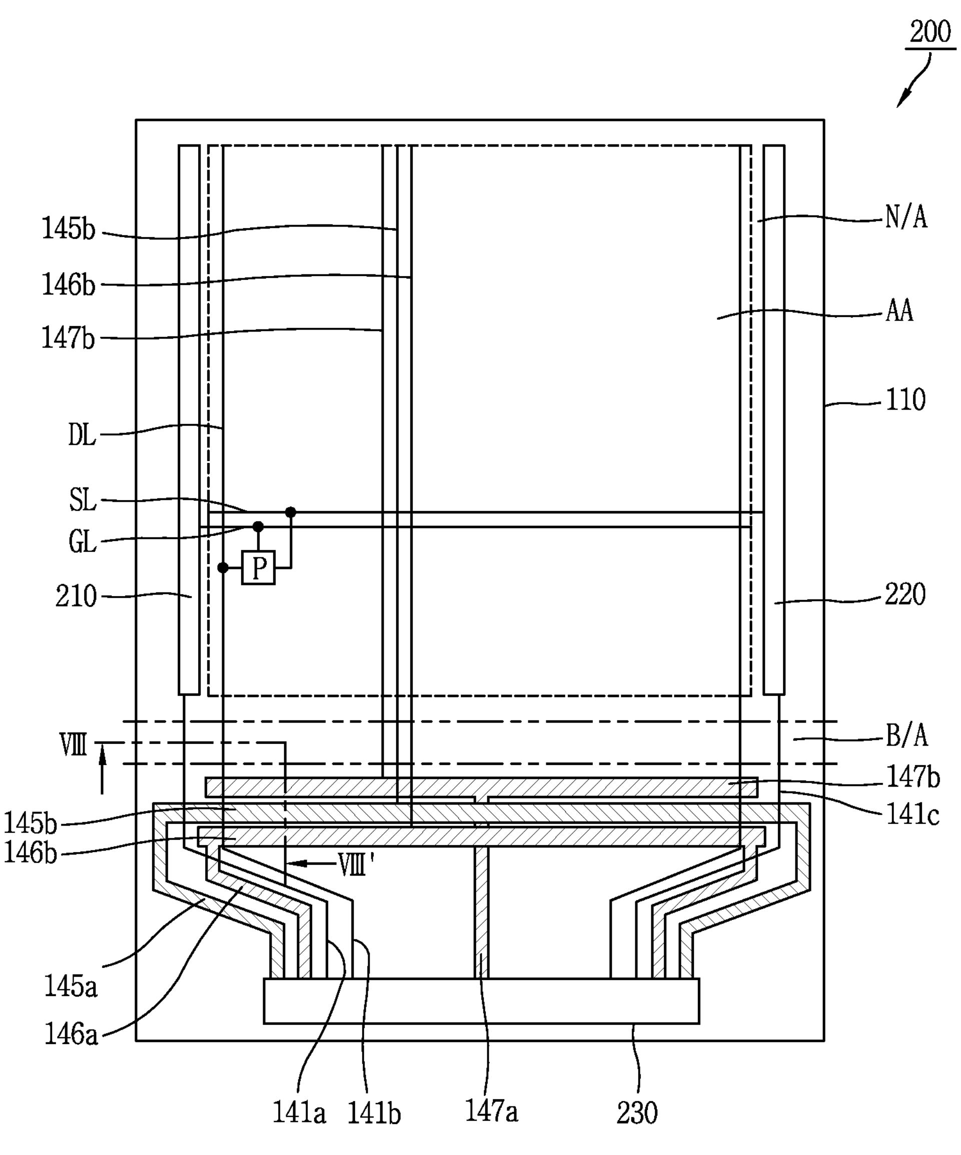
FIG. 8 is a planar view of a flexible OLED display device according to a second embodiment of the present invention.

FIG. 8 is a planar view of a flexible OLED display device according to a second embodiment of the present invention.

Referring to FIG. 8, the flexible OLED display device according to the second embodiment may be formed on a flexible substrate 110 having an active area (A/A) and a non-active area (N/A).

The active area (A/A) is a region where an image is substantially displayed. On the active area (A/A), a plurality of gate lines (GL) and a plurality of data lines (DL) may be formed to cross each other, thereby defining pixel regions. A plurality of sensing lines (SL) may be formed in parallel to the plurality of gate lines (GL).

Power lines for supplying a driving voltage (VDD), a reference voltage (Vref) and a ground voltage (GND) to pixel regions, e.g., a driving voltage line 146*b*, a reference voltage line 147*b* and a ground line 145*b* may be formed in the active area (A/A).

A pixel (P) having a plurality of switching devices may be formed at the pixel region. The pixel (P) may be the same pixel as described above with reference to FIG. 5.

The non-active area (N/A) of the flexible OLED display device 200 may be formed around the active area (A/A), which may be defined by the dotted line. Driving circuitry for driving the pixels (P) in the active area (A/A) and wires may be formed in the non-active area (N/A).

The driving circuitry may include a data driving portion 230, a gate driving portion 210 and a light-emitting controller 220.

The data driving portion 230 may be mounted in the non-active area (N/A) positioned below the active area (A/A), i.e., the lower-end non-active area (N/A). The gate driving portion 210 and the light-emitting controller 220 may be formed in the non-active area (N/A), i.e., at two sides outside the active area (A/A), in the form of a gate in panel (GIP).

The data driving portion 230 may generate a data signal by receiving a signal from an external circuit. The generated data signal may be output to the plurality of data lines (DL) in the active area (A/A) through wires. The gate driving portion 210 may output a gate signal provided from the data driving portion 230, to the plurality of gate lines (GL) in the active area (A/A), through wires. The light-emitting controller 220 may output a light-emitting signal provided from the data driving portion 230, to the plurality of sensing lines (SL) in the active area (A/A), through wires.

Wires may include power lines including driving voltage lines 146*a*, 146*b*, reference voltage lines 147*a*, 147*b*, and ground lines 145*a*, 145*b*, and signal lines including a gate signal line 141*a*, a data signal line 141*b*, and a light-emitting signal line 141*c*.

The driving voltage lines 146*a*, 146*b* may be formed in the lower end non-active area (N/A), and may output a driving voltage (VDD) provided from the data driving portion 230 to the pixel (P) in the active area (A/A).

The driving voltage lines 146*a*, 146*b* may include a first driving voltage line 146*a* and a second driving voltage line 146*b*. The first driving voltage line 146*a* connected to the data driving portion 230. The second driving voltage line 146*b* may be connected to the first driving voltage line 146*a*, and formed as a bar in a direction parallel to the data driving portion 230. The second driving voltage line 146*b* may be formed such that one side thereof is connected to the first driving voltage line 146*a*, and another side thereof is extending to the pixel (P) in the active area (A/A). Based on this configuration, the second driving voltage line 146*b* may output a driving voltage (VDD) provided through the first driving voltage line 146*a* to each pixel (P).

The reference voltage lines 147*a*, 147*b* may be formed in the lower end non-active area (N/A), and may output a reference voltage (Vref) provided from the data driving portion 230 to the pixel (P) in the active area (A/A).

The reference voltage lines 147*a*, 147*b* may include a first reference voltage line 147*a* and a second reference voltage line 147*b*. The first reference voltage line 147*a* connected to the data driving portion 230. The second reference voltage line 147*b* may be connected to the first reference voltage line 147*a*, and formed as a bar in parallel to the second driving voltage line 146*b*. The second reference voltage line 147*b* may be formed such that one side thereof is connected to the first reference voltage line 147*a*, and another side thereof is extending to the pixel (P) in the active area (A/A). Based on this configuration, the second reference voltage line 147*b* may output a reference voltage (Vref) provided through the first reference voltage line 147*a* to each pixel (P).

The ground lines 145*a*, 145*b* may be formed in the lower end non-active area (N/A), and may output a ground voltage (GND) provided from the data driving portion 230 to the pixel (P) in the active area (A/A).

The ground lines 145*a*, 145*b* may include a first ground line 145*a* and a second ground line 145*b*. The first ground line 145*a* may be connected to the data driving portion 230. Further, the second ground line 145*b* may be connected to the first ground line 145*a*, and formed as a bar in a direction parallel to the second driving voltage line 146*b* and the second reference voltage line 147*b*. The second ground line 145*b* may be formed such that one side thereof is connected to the first ground line 145*a*, and another side thereof is extending to the pixel (P) in the active area (A/A). Based on this configuration, the second ground line 145*b* may output a ground voltage (GND) provided through the first ground line 145*a* to each pixel (P).

The gate signal line 141*a* may be formed in the lower end non-active area (N/A), between the data driving portion 230 and the gate driving portion 210. The gate signal line 141*a* may output a gate signal provided from the data driving portion 230 to the gate driving portion 210. The gate signal may be output to the plurality of gate lines (GL) in the active area (A/A), through the gate driving portion 210.

The data signal line 141*b* may be formed in the lower end non-active area (N/A), between the data driving portion 230 and the data line (DL) in the active area (A/A). The data signal lines 141*b* may output data signals provided from the data driving portion 230 to the plurality of data lines (DL) in the active area (A/A).

The light-emitting signal line 141*c* may be formed in the non-active area (N/A), between the data driving portion 230 and the light-emitting controller 220. The light-emitting signal line 141*c* may output a light-emitting signal provided from the data driving portion 230, to the light-emitting controller 220. The light-emitting signal may be output to the plurality of sensing lines (SL) in the active area (A/A), by the light-emitting controller 220.

In the flexible OLED display device 200 according to the second embodiment of the present invention, the lower end non-active area (N/A) may include a bending area (B/A). The bending area (B/A) may be a region which has a predetermined curvature when part of the lower end non-active area (N/A) is bent to the front or rear surface of the flexible OLED display device 200.

The lower end non-active area (N/A) may be divided, for example, into three regions by the bending area (B/A). For instance, the lower end non-active area (N/A) may be divided into a first area between the bending area (B/A) and the active area (A/A), the bending area (B/A), and a second area between the bending area (B/A) and an area where the data driving portion 230 has been mounted.

The first area of the lower end non-active area (N/A) may be a region covered by a bezel portion, etc., together with the rest of the non-active area (N/A). Also, the second area may be a region positioned on the rear surface of the flexible OLED display device 200, by bending of the bending area (B/A).

The plurality of data signal lines 141*b* and the plurality of power lines may be formed in the first area. The plurality of power lines include the second driving voltage line 146*b*, the second reference voltage line 147*b* and the second ground line 145*b*. The plurality of data signal lines 141*b* may be connected to the plurality of data lines (DL) in the active area (A/A). The plurality of data signal lines 141*b* and the plurality of power lines may be formed in the first area in parallel with each other.

In the bending area (B/A) of the lower end non-active area (N/A), the plurality of data signal lines 141*b* and the plurality of power lines formed in the first area, may be formed in parallel with each other.

In the bending area (B/A) of the lower end non-active area (N/A), the plurality of lines extending from the power lines toward the active area (A/A), the plurality of data signal lines 141*b*, the gate signal lines 141*a* and the light-emitting signal lines 141*c* may be formed so as to be spaced from each other on the same layer on the flexible substrate 110.

In the second area of the lower-end non-active area (N/A), signal lines including the gate signal lines 141*a*, the data signal lines 141*b* and the light-emitting signal lines 141*c* may be formed to cross power lines. The power lines, which may have a bar shape, may include first and second driving voltage lines 146*a*, 146*b*, first and second reference voltage lines 147*a*, 147*b*, and first and second ground lines 145*a*, 145*b*. The signal lines and the power lines in the second area may be formed to overlap each other on different layers on the flexible substrate 110.

The signal lines and the power lines may be formed to be in parallel to each other in the first area and the bending area (B/A), by being bent at least twice in the second area.

That is, in the flexible OLED display device 200 according to the second embodiment, a plurality of signal lines and a plurality of power lines may be formed to cross each other in the second area positioned on the rear surface of the flexible OLED display device 200 when the bending area (B/A) of the lower end non-active area (N/A) is bent toward the rear surface of the device 200. Thus, in the flexible OLED display device 200 according to the second embodiment, the width of the lower end non-active area (N/A) can be more reduced than in the conventional flexible OLED display device. As a result, the flexible OLED display device 200 according to the second embodiment can have a narrow bezel portion.

As mentioned above, in the flexible OLED display device 200 according to the second embodiment, a plurality of signal lines and a plurality of power lines are formed on the same layer in parallel to each other, in the bending area (B/A) of the lower end non-active area (N/A). Accordingly, unlike in the conventional art, disconnection of the wires can be prevented even if an insulating layer is damaged due to bending stress.

In the first area and the bending area (B/A) of the lower end non-active area (N/A), wires are formed on the same layer in accordance with one embodiment of the invention. However, in the second area, wires may be formed on different layers. Based on this configuration, wires formed on different layers in the second area may be connected to wires formed on the same layer in the bending area (B/A), through holes (not shown).

Figure 9:
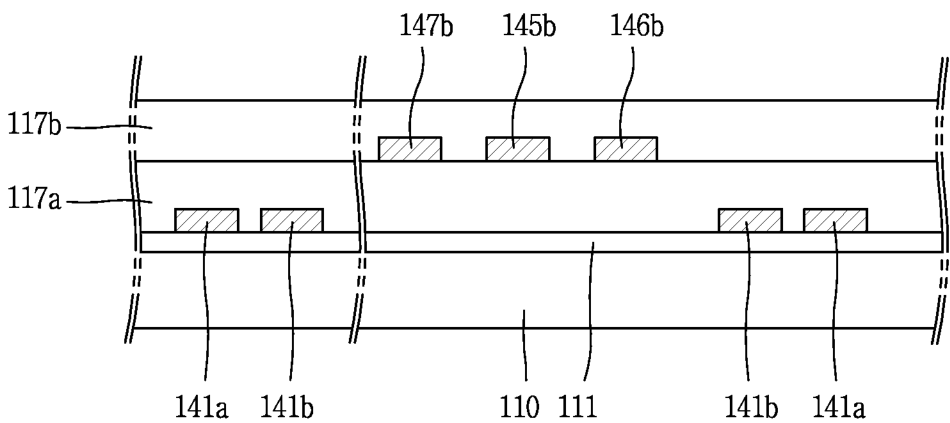
FIG. 9 is a cross-sectional view taken along line VIII-VIII' in the flexible OLED display device of FIG. 8.

FIG. 9 is a cross-sectional view taken along line VIII~VIII' in the flexible OLED display device of FIG. 8.

Referring to FIGS. 8 and 9, in the bending area (B/A) of the lower end non-active area (N/A) of the flexible OLED display device 200, a plurality of wires may be formed on the same layer in a spaced manner from each other.

For instance, in the bending area (B/A), a passivation layer 111 is formed on a flexible substrate 110. A gate signal line 141*a*, a data signal line 141*b*, a second ground line 145*b* and a second driving voltage line 146*b* may be formed on the passivation layer 111, such that they are spaced from each other with predetermined distances, in parallel to each other.

A first insulating layer 117*a* may be formed on the gate signal line 141*a*, the data signal line 141*b*, the second ground line 145*b* and the second driving voltage line 146*b*.

A plurality of wires may be formed to overlap each other on different layers, in the second area positioned on the rear surface of the flexible OLED display device 200 when the bending area (B/A) of the lower end non-active area (N/A) is bent.

For instance, in the second area, a passivation layer 111 is formed on a flexible substrate 110. A gate signal line 141*a* and a data signal line 141*b* may be formed on the passivation layer 111, such that they are spaced from each other in parallel to each other.

A first insulating layer 117*a* may be formed on the gate signal line 141*a* and the data signal line 141*b*. A second ground line 145*b* and a second driving voltage line 146*b* may be formed on the first insulating layer 117*a*, with a predetermined distance therebetween in parallel to each other. In this case, the second ground line 145*b* and the second driving voltage line 146*b* may be formed to overlap the gate signal line 141*a* and the data signal line 141*b*.

A second insulating layer 117*b* may be formed on the second ground line 145*b* and the second driving voltage line 146*b*.

In the flexible OLED display device 200 according to the second embodiment, the pixel region in the active area (A/A) has the same cross-sectional profile as the pixel region described above with reference to FIG. 6, of which description is not repeated.

A plurality of wires formed in the non-active area (N/A) may be formed of the same metallic material as a source electrode (not shown) and a drain electrode (not shown) in the pixel region, at the same processing stage. The plurality of wires indicate power lines including the second ground line 145*b* and the second driving voltage line 146*b*, and signal lines including the gate signal line 141*a* and the data signal line 141*b*. For instance, the plurality of wires may be formed of a metallic material such as Ti, Al and Mo or an alloy thereof such as Ti/Al/Ti and Mo/Al.

Figure 10:
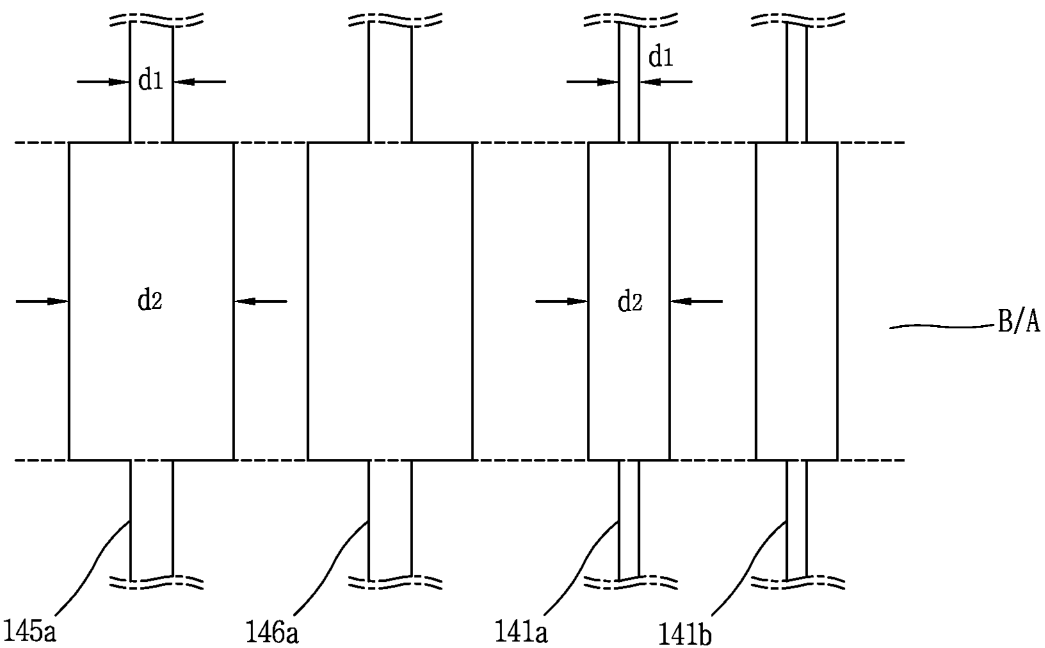
FIG. 10 is a view illustrating a wire structure in a bending area in a flexible OLED display device according to the present invention.
Figure 11:
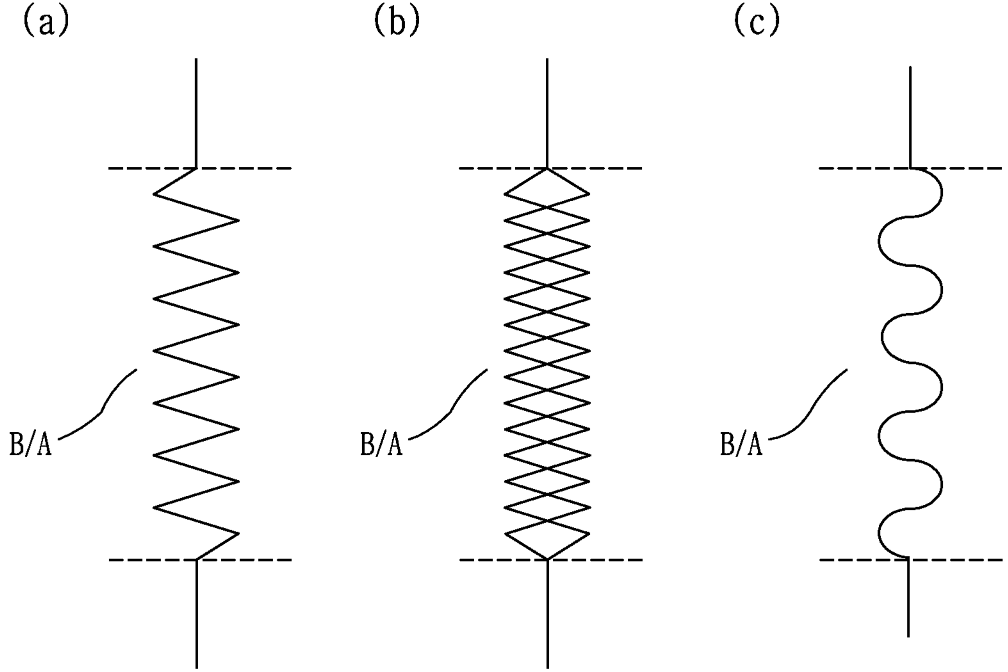
FIG. 11 is a view illustrating various embodiments of FIG. 10.

FIG. 10 is a view illustrating a wire structure in a bending area in a flexible OLED display device according to the present invention, and FIG. 11 is a view illustrating various embodiments of FIG. 10.

In this embodiment, the flexible OLED display device 100 of FIG. 4 will be explained for convenience. However, this embodiment may be also applicable to the flexible OLED display device 200 of FIG. 8.

Referring to FIGS. 4 and 10, in the flexible OLED display device 100, wires may be formed to have a large width for prevention of disconnection thereof due to bending stress in the bending area (B/A) of the lower end non-active area (N/A).

For instance, as shown in FIG. 10, the width (d2) of wires in the bending area (B/A) of the lower end non-active area (N/A) may be greater than the width (d1) of wires in the first area and the second area of the lower end non-active area (N/A).

As shown in FIG. 11, wires are formed, in the bending area (B/A), with a shape such as a triangle, a diamond, a semi-circle and a circle. Thus, disconnection of the wires, due to bending stress occurring when the bending area (B/A) is bent, can be prevented.

That is, in the flexible OLED display device 100, disconnection of wires, which occurs when the bending area (B/A) is bent, can be prevented by various shape changes of the wires in the bending area (B/A). In order to prevent resistance increase of the wires due to the shape changes of the wires, the wires may be formed such that the width in the bending area (B/A) is larger than that in the other regions. As a result, disconnection of the wires, which occurs when the bending area (B/A) is bent, can be prevented.

The aforementioned wires may be power lines including the first ground line 145*a* and the first driving voltage line 146*a*, and signal lines including the gate signal line 141*a* and the data signal line 141*b*.

The foregoing embodiments and advantages are merely exemplary and are not to be considered as limiting the present disclosure. The present teachings can be readily applied to other types of apparatuses. This description is intended to be illustrative, and not to limit the scope of the claims. Many alternatives, modifications, and variations will be apparent to those skilled in the art. The features, structures, methods, and other characteristics of the exemplary embodiments described herein may be combined in various ways to obtain additional and/or alternative exemplary embodiments.

As the present features may be embodied in several forms without departing from the characteristics thereof, it should also be understood that the above-described embodiments are not limited by any of the details of the foregoing description, unless otherwise specified, but rather should be considered broadly within its scope as defined in the appended claims, and therefore all changes and modifications that fall within the metes and bounds of the claims, or equivalents of such metes and bounds are therefore intended to be embraced by the appended claims.

What is claimed is:

1. A display device comprising:

a flexible substrate including an active area, a non-active area and a bending area;

the active area including pixels to display images, each pixel including:

a first switching transistor, a second switching transistor, and a driving transistor, wherein the first switching transistor, the second switching transistor, and the driving transistor are formed of amorphous silicon or poly-crystalline silicon, wherein the first switching transistor includes a gate electrode connected to a first gate line, a source electrode connected to a data line, and a drain electrode connected to the driving transistor, wherein the driving transistor includes a gate electrode connected to the drain electrode of the first switching transistor, a source electrode coupled to drive an organic light emitting diode (OLED), and a drain electrode coupled to receive a driving voltage from a driving voltage line, and wherein the second switching transistor includes a gate electrode connected to a second gate line, a source electrode connected to the OLED, and a drain electrode connected to a voltage line; and a planarization layer on the flexible substrate where the driving transistor is formed;

a first electrode on the planarization layer in the active area and connected to the drain electrode of the driving transistor through a contact hole of the planarization layer;

a pixel defining layer that is on the first electrode, with a portion of the first electrode being exposed by the pixel defining layer;

a light-emitting layer on the pixel defining layer and the exposed portion of the first electrode;

a second electrode on the light-emitting layer, wherein at least a portion of the first electrode, the light-emitting layer, and the second electrode forms the OLED;

the non-active area including a driving circuitry, the driving circuitry includes:

a data driving portion mounted in the non-active area positioned below the active area;

a gate driving portion in the non-active area outside the active area, in a form of a gate in panel (GIP); and a light-emitting controller in the non-active area outside the active area, in the form of the GIP, and outputting a light emitting signal provided from the data driving portion;

at least two different power lines, wherein at least two or more power lines of the at least two different power lines are arranged directly on a same layer in the bending area between the data driving portion and the active area, wherein the at least two different power lines include a first power line supplying a voltage at a first level and a second power line supplying a voltage at a second level different from the first level.

2. The display device of claim 1, further comprising:

a first insulating layer on a gate signal line and a data signal line in the bending area; and a second insulting layer over the first insulating layer.

3. The display device of claim 1, wherein each pixel has a structure where at least the first switching transistor, the second switching transistor, one or two capacitors and the organic light emitting diode (OLED) are formed.

4. The display device of claim 1, wherein the flexible substrate further includes a first area and a second area, and wherein the first area is located between the active area and the bending area, and the second area is located between the bending area and an area where the data driving portion has been mounted.

5. The display device of claim 4, wherein the light emitting layer is configured to receive a signal from at least one signal line and power from at least one power line of the at least two different power lines to display the images.

6. The display device of claim 5, wherein the first power line is connected to the data driving portion, and the second power line is connected to the first power line and formed as a bar in a direction parallel to the data driving portion in the first area.

7. The display device of claim 5, wherein the at least one signal line and the at least one power line are formed on a same layer in the bending area, and wherein the at least one signal line and the at least one power line are formed on different layers outside the bending area.

8. The display device of claim 5, wherein the at least one signal line includes at least one of:

the first gate line to supply a gate signal to the pixels, and the data line to supply a data signal to the pixels, and wherein the at least one power line includes at least one of:

the driving voltage line to supply the driving voltage to a corresponding organic light emitting layer, the voltage line to supply a reference voltage to the corresponding organic light emitting layer, and a ground voltage line.

9. The display device of claim 5, wherein the bending area is configured to be bent and located between the first area and the second area, the bending area including the at least one signal line and the at least one power line that are made of a same material as the source electrode or the drain electrode of the driving transistor in the active area.

10. The display device of claim 5, wherein a width of the at least one signal line and the at least one power line in the bending area is greater than a width of the at least one signal line and the at least one power line in the first area or the second area.

11. The display device of claim 5, wherein the at least one signal line and the at least one power line are formed in a circle shape or a diamond shape.

12. The display device of claim 5, wherein the at least one signal line and the at least one power line are formed in a triangle shape.

13. The display device of claim 5, wherein the at least one signal line and the at least one power line are formed with a shape as a semi-circle or a zigzag in the bending area.

14. The display device of claim 13, wherein the at least one signal line and the at least one power line are formed as two or more repeated semi-circle shapes or the zigzag shapes in the bending area.

15. The display device of claim 1, wherein the source electrode and the drain electrode of the driving transistor are made of a metallic material such as Ti, Al and Mo, or an alloy thereof such as Ti/Al/Ti and Mo/Al.

16. The display device of claim 1, wherein the gate driving portion is disposed at one side of the non-active area outside the active area, in the form of the GIP and the light-emitting controller is disposed at another side of the non-active area outside the active area, in the form of the GIP.

17. The display device of claim 1, wherein the second switching transistor senses a threshold voltage of the driving transistor.

18. The display device of claim 1, wherein the second switching transistor is turned on before the first switching transistor.

19. The display device of claim 1, wherein the first gate line and the second gate line are electrically connected to the gate driving portion, and wherein the gate driving portion is electrically connected to at least one gate signal line, and wherein the data line is electrically connected to a data signal line.

20. The display device of claim 19, wherein at least portions of the at least one gate signal line and the data signal line are disposed on a same layer.

* * * * *